United States Patent
Dean, Jr. et al.

(10) Patent No.: US 8,136,084 B2
(45) Date of Patent: Mar. 13, 2012

(54) ARRANGING THROUGH SILICON VIAS IN IC LAYOUT

(75) Inventors: Donald R. Dean, Jr., Essex Junction, VT (US); Peter J. Lindgren, Essex Junction, VT (US); Glen L. Miles, Hopewell Junction, NY (US); Edmund J. Sprogis, Essex Junction, VT (US); Anthony K. Stamper, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 12/555,981

(22) Filed: Sep. 9, 2009

(65) Prior Publication Data

US 2011/0057319 A1      Mar. 10, 2011

(51) Int. Cl.
*G06F 17/52* (2006.01)

(52) U.S. Cl. ......... 716/139; 716/111; 716/126; 716/132

(58) Field of Classification Search .................. 716/111, 716/126, 132, 139
See application file for complete search history.

(56) References Cited

U.S. PATENT DOCUMENTS

| | | |
|---|---|---|
| 4,686,629 A | 8/1987 | Noto et al. |
| 5,031,111 A | 7/1991 | Chao et al. |
| 5,144,563 A | 9/1992 | Date et al. |
| 6,271,548 B1 * | 8/2001 | Umemoto et al. ............ 257/202 |
| 7,205,639 B2 | 4/2007 | Hierlemann et al. |
| 7,528,006 B2 | 5/2009 | Arana et al. |
| 7,542,891 B2 | 6/2009 | Lin et al. |
| 7,712,064 B2 | 5/2010 | Scheffer et al. |
| 2007/0202662 A1 | 8/2007 | Lin et al. |
| 2007/0202663 A1 | 8/2007 | Moroz et al. |
| 2008/0066023 A1 | 3/2008 | Xu et al. |
| 2008/0127005 A1 | 5/2008 | Lin et al. |
| 2009/0191708 A1 | 7/2009 | Kropewnicki et al. |
| 2010/0032764 A1 | 2/2010 | Andry et al. |

OTHER PUBLICATIONS

Dao et al., "Through Silicon Via Stress Characterization," May 2009, 3 pages, IEEE. 2009.
Yang et al., "TSV Stress Aware Timing Analysis with Applications to 3D-IC Layout Optimization," Jun. 2010, pp. 803-806, Design Automation Conference (DAC) 2010.
Lim, "TSV-Aware 3D Physical Design Tool Needs for Faster Mainstream Acceptance of 3D ICs," Jun. 2010, Design Automation Conference (DAC) 2010.
Van der Plas et al., "Design Issues and Considerations for Low-Cost 3D TSV IC Technology," Feb. 2010, 3 pages, 2010 IEEE International Solid-State Circuits Conference.
Beica, et al., "Through Silicon Via Copper Electrodeposition for 3D Integration", Electronic Components and Technology Conference 2008, 58th Volume, Issue 27-30, May 2008, pp. 577-583.
Vardaman, Jan, "3-D Through Silicon Vias Become a Reality", Semiconductor International, Jun. 1, 2007, http://www.semiconductor.net/article/CA6445435.html.
Merritt, Rick, "IBM advances through-silicon via packaging tech", http://lwww.eetasia.com/ART_8800461137_480400_NT_e7156731.HTM, posted Apr. 17, 2007, 3 pages.

* cited by examiner

*Primary Examiner* — Thuan Do
(74) *Attorney, Agent, or Firm* — Richard Kotulak; Hoffman Warnick LLC (57) ABSTRACT

A portion of an IC layout that includes a plurality of through silicon vias (TSVs) is evaluated to identify linearly aligned TSVs. The portion of the IC layout is modified to reduce a number of the linearly aligned TSVs, resulting in less wafer breakage.

14 Claims, 7 Drawing Sheets

ARRANGING THROUGH SILICON VIAS IN IC LAYOUT

BACKGROUND

1. Technical Field

The disclosure relates generally to through silicon vias, and more particularly, to arranging through silicon vias (TSVs) in an integrated circuit (IC) layout to reduce linearly aligned TSVs.

2. Background Art

Through silicon vias (TSVs) are vias that extend through a semiconductor wafer to allow wafer-to-wafer interconnects that are compatible with three-dimensional wafer-level packaging. TSVs are typically elongated in one direction.

BRIEF SUMMARY

A first aspect of the disclosure provides a method comprising: identifying linearly aligned through silicon vias (TSVs) in a portion of an integrated circuit (IC) layout that includes a plurality of TSVs; and modifying at least the portion of the IC layout to reduce a number of the linearly aligned TSVs.

A second aspect of the disclosure provides a system comprising: an identifier for identifying linearly aligned through silicon vias (TSVs) in a portion of an integrated circuit (IC) layout that includes a plurality of TSVs; and a modifier for modifying at least the portion of the IC layout to reduce a number of the linearly aligned TSVs.

A third aspect of the disclosure provides a program product stored on a computer-readable medium, which when executed, arranges through silicon vias, the program product comprising: program code for identifying linearly aligned through silicon vias (TSVs) in a portion of an integrated circuit (IC) layout that includes a plurality of TSVs; and program code for modifying at least the portion of the IC layout to reduce a number of the linearly aligned TSVs.

A fourth aspect includes an integrated circuit comprising: a plurality of sets of through silicon vias (TSVs), each set including a plurality of TSVs aligned in a selected one of an x-direction and a y-direction, wherein a direction of layout of the plurality of sets alternate in the x-direction and the y-direction.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
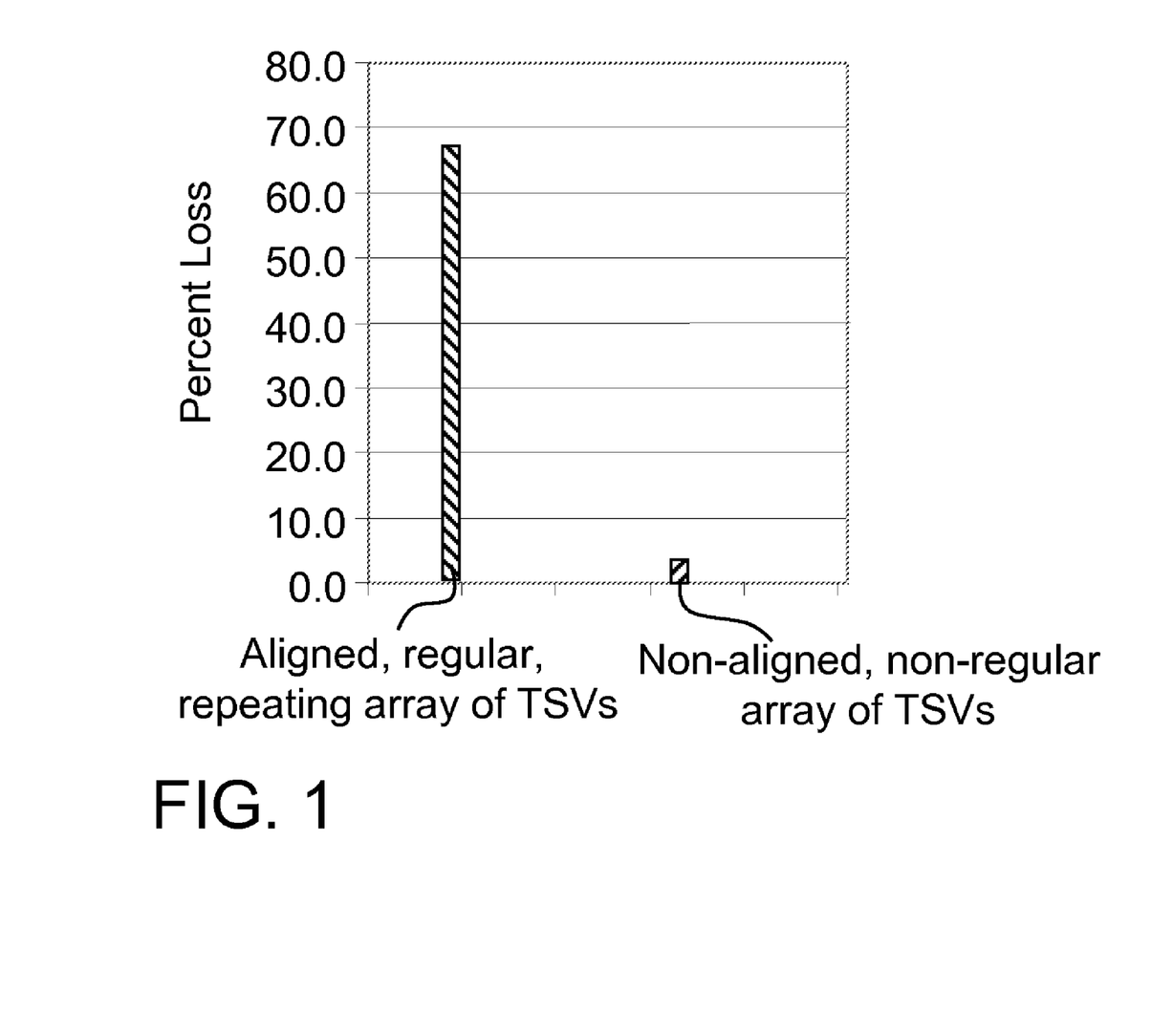
FIG. 1 shows a graph illustrating wafer breakage percent loss for wafers including TSVs.

Through silicon vias (TSVs) are typically elongated vias. TSVs may be etched, for example, 5 µm to 200 µm deep into a semiconductor wafer and may be, for example, 3 µm wide by 50 µm long. The conductive portion of TSVs can be formed with metal (e.g., copper, aluminum, etc.) or metal with a dielectric liner such as silicon dioxide, silicon nitride, etc. In the former case, the metal may be in direct contact with silicon or dielectric materials. A TSV is typically partially etched into a substrate, such as silicon, and, at a subsequent process step, the bottom of the TSV is exposed by removing the backside of the substrate by, for example, mechanically grinding or etching. It has been discovered that when TSVs are aligned they act like perforations making it easy to break a wafer into which they are formed. FIG. 1 shows a graph evidencing the problem. In particular, wafers having aligned, regularly repeating TSV arrays break at an approximately 66% rate, while those with non-aligned, non-regular TSV arrays break at an approximately 4% rate. Wafers having a <100> surface orientation break vertically relative to the notch, while those with <110> surface orientation break at angle relative to the notch. In one study, a wafer with no TSVs had a median breakage force of approximately 392 MPa, while an identical wafer with aligned TSVs had a median breakage force of approximately 119 MPa. Embodiments of the present invention address this newly recognized issue by identifying linearly aligned TSVs in a portion of an integrated circuit (IC) layout that includes a plurality of TSVs, and modifying at least the portion of the IC layout to reduce a number of the linearly aligned TSVs.

As will be appreciated by one skilled in the art, the present invention may be embodied as a system, computerized method or computer program product. It cannot be accomplished using solely mental steps. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer usable program code may be transmitted using any appropriate medium, including but not limited to wireless, wireline, optical fiber cable, RF, etc.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
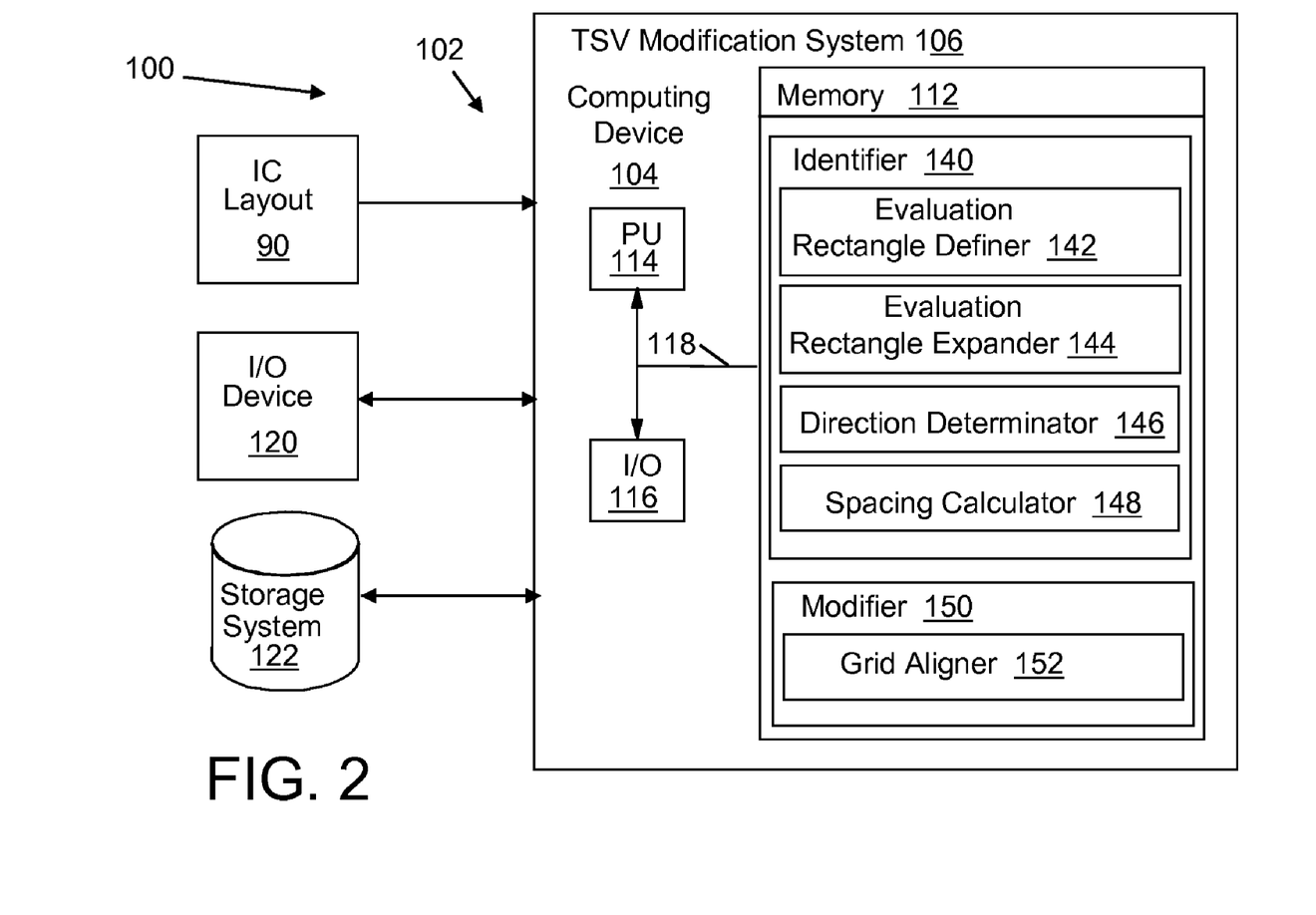
FIG. 2 shows a block diagram of a TSV modification system.

FIG. 2 shows an illustrative environment 100 for laying out and arranging TSVs in an integrated circuit (IC) design. As understood, IC layout 90 represents a physical circuit. To this extent, environment 100 includes a computer infrastructure 102 that can perform the various process steps described herein. In particular, computer infrastructure 102 is shown including TSV modification system 106, which may include a computing device 104 that performs the processes of the disclosure.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as TSV modification system 106, that is stored in memory 112 and/or storage system 122. While executing computer program code, processor 114 can read and/or write data, such as IC layout 90, to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general or specific purpose computing article of manufacture capable of executing computer program code installed by a user (e.g., a personal computer, server, handheld device, etc.). However, it is understood that computing device 104 and TSV modification system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

TSV modification system 106 is shown including an identifier 140 including an evaluation rectangle definer 142, an evaluation rectangle expander 144, a direction determinator 146 and a spacing calculator 148; and a modifier 150 including a grid aligner 152. Operation of each of these systems is discussed further below. However, it is understood that some of the various systems shown in FIG. 2 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 3:
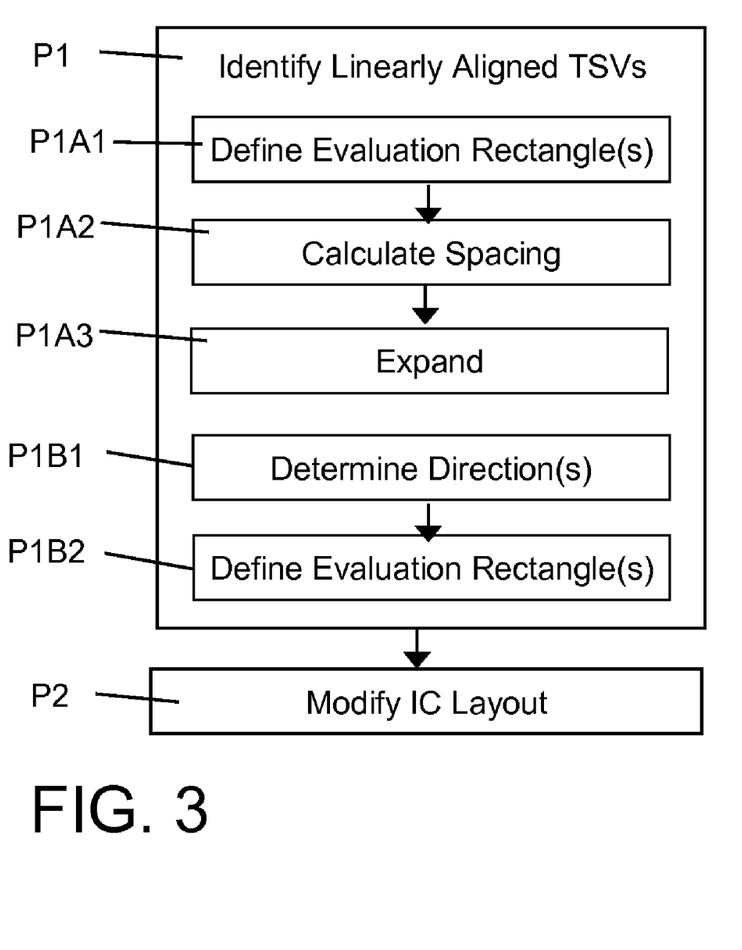
FIG. 3 shows a flow diagram illustrating operational methodologies of the system of FIG. 2.

Referring to the flow diagram of FIG. 3 in conjunction with the block diagram of FIG. 2 and the schematic diagrams of FIGS. 4-7, operational methodologies of TSV modification system 106 will now be described. In process P1, identifier 140 identifies linearly aligned through silicon vias (TSVs) in a portion of IC layout 90 (FIG. 2) that includes a plurality of TSVs, and in process P2, modifier 150 modifies at least the portion of IC layout 90 to reduce a number of the linearly aligned TSVs. The particulars of each process may vary depending on the arrangement of TSVs present.

Figure 4:
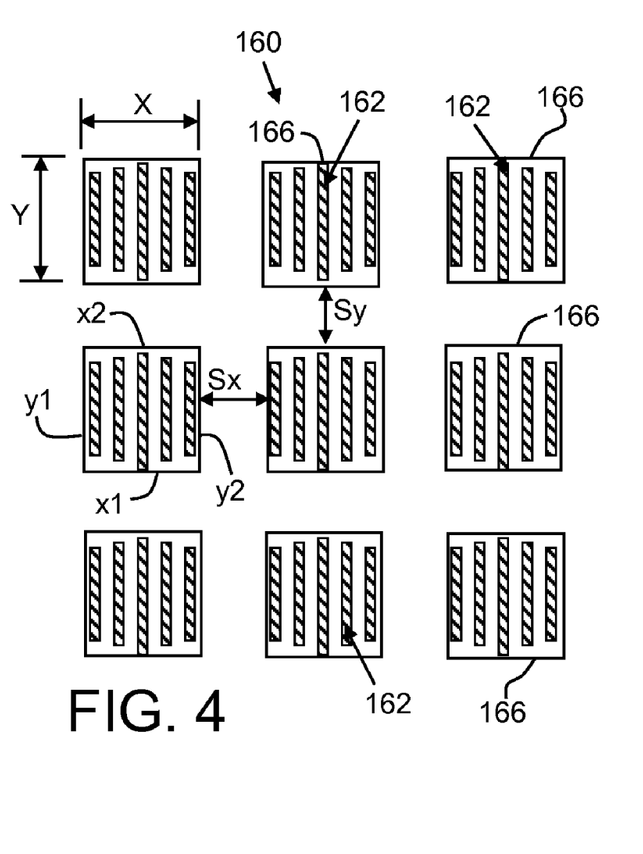
FIGS. 4-7 show a top, schematic views of a portion of a circuit layout illustrating application of the TSV modification system to an array of TSV sets.

FIGS. 4-7 show top views of one TSV layout embodiment in which IC layout 90 (FIG. 2) includes an array 160 having a substantially uniform periodicity of TSV sets 162 in both the X and Y directions. FIG. 4 shows an illustrative portion of IC layout 90 including array 160 having nine TSV sets 162. Each TSV set 162 includes all of two or more TSVs therein arranged in a given direction, e.g., vertically as shown in FIG. 4. In this example, all of the TSVs in TSV sets 162 in IC layout 90 initially extend in a single, given direction, i.e., an x-direction or a y-direction. In this case, in process P1A1, evaluation rectangle definer 142 defines a TSV set evaluation rectangle 166 about each TSV set 162. Each TSV set evaluation rectangle 166 is defined to include a least enclosing rectangle (i.e., shrunken around TSV set) having a set X dimension and a set Y dimension, where X and Y are not equal. Each TSV set evaluation rectangle 166 also defines a pair of X edges x1, x2 and a pair of Y edges y1, y2. In process P1A2, spacing calculator 148 calculates a Y spacing Sy between adjacent TSV evaluation rectangles 166 and an X spacing Sx between adjacent TSV evaluation rectangles 166.

Figure 5:
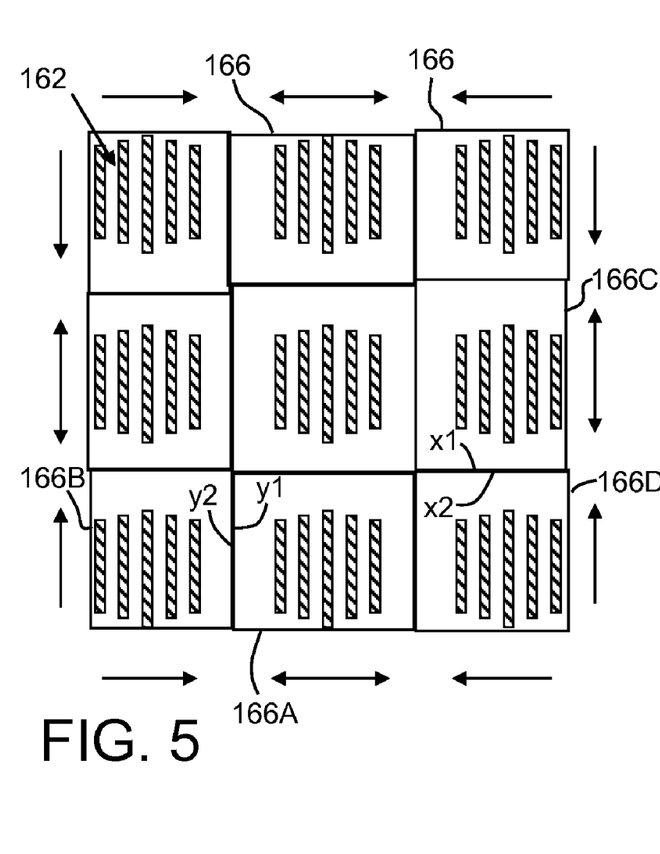

As shown in FIG. 5, in process P1A3, evaluation rectangle expander 144 expands each TSV evaluation rectangle 166 edge x1, x2, y1, y2 in at least one Y direction by half the predetermined Y spacing Sy (i.e., Sy/2) between adjacent TSV evaluation rectangles 162 and in at least one X direction by half the predetermined X spacing Sx between adjacent TSV evaluation rectangles (i.e., Sx/2). Evaluation rectangle expander 144 performs this function for each edge x1, x2, y1, y2 except for those at a chip edge, i.e., an edge of IC layout 90. FIG. 5 shows expansion of evaluation rectangles 162 (shown by arrows) of FIG. 4.

Figure 6:
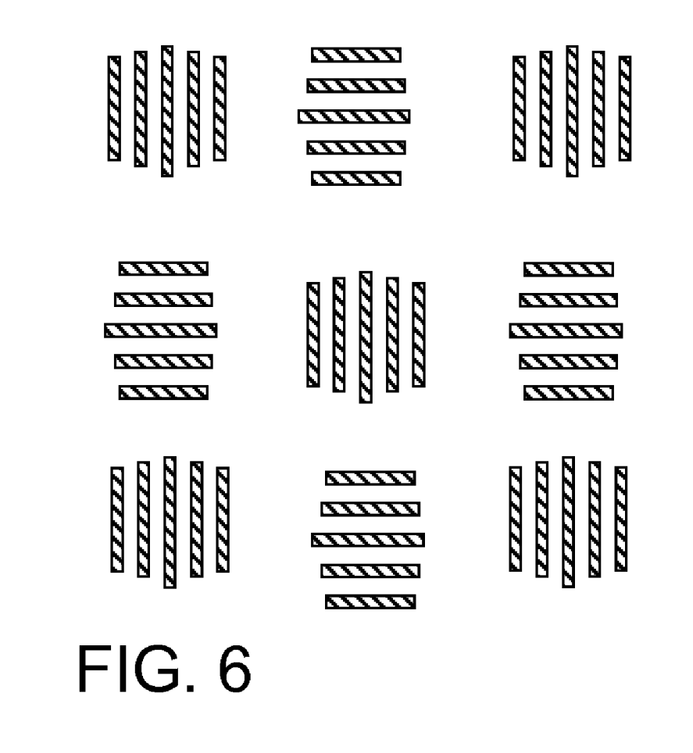

In process P2, as observed in FIGS. 5 and 6, modifier 150, in response to a Y edge of a selected, expanded TSV evaluation rectangle (e.g., y1 of 166A) contacting a Y edge of an adjacent, expanded TSV evaluation rectangle (e.g., y2 of 166B) rotates the TSV set 162 within the selected TSV evaluation rectangle 166A to be non-aligned to the given direction. Similarly, modifier 150, in response to an X edge of the selected, expanded TSV evaluation rectangle (e.g., x1 of 166C) contacting an X edge of an adjacent, expanded TSV evaluation rectangle (e.g., x2 of 166D) rotates TSV set 162, to be non-aligned to the given direction. If space remains between the edges, or edges are overlapping, no rotation is performed. In the examples shown, the given direction is vertical on the page and TSV set 162 of evaluation rectangle 166A is rotated so as to be substantially perpendicular to the given direction, i.e., horizontal as shown. However, other angles may also be possible. FIG. 6 shows the results of the above-described process after application to each evaluation rectangle 166. In this case, the process results in a checkerboard layout of TSV sets 162. That is, the resulting integrated circuit includes a plurality of sets 162 of TSVs with each set including a plurality of TSVs aligned in a selected one of an x-direction and a y-direction, but a direction of layout of the plurality of sets 162 alternate in the x-direction and the y-direction. This may not occur in all cases.

Figure 7:
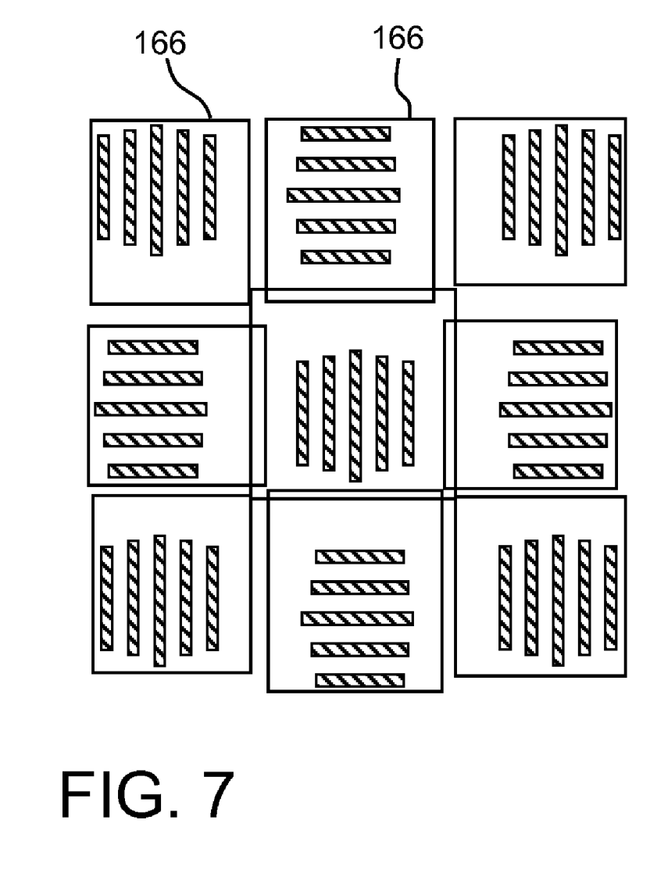

FIG. 7 shows the results of repeating the identifying and the modifying on array 160, i.e., at a point at which evaluation rectangles 166 no longer contact, but overlap or have space remaining between one another.

In process P2, modifier 150 may also ensure each individual TSV within a TSV set 162 is on a predetermined grid for IC layout 90 regardless of position, e.g., on 150-185 um in X and Y direction. That is, modifier 150 may ensure that TSVs still follow other spacing ground rules for IC layout 90.

Figure 8:
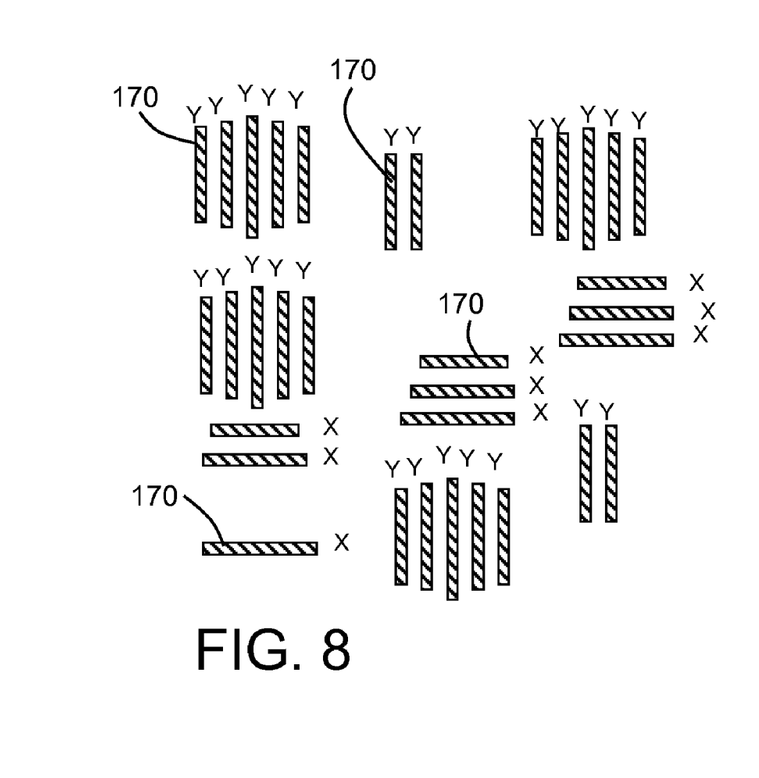
FIGS. 8-10 show schematic diagrams illustrating application of the TSV modification system to randomly assorted TSVs.
Figure 9:
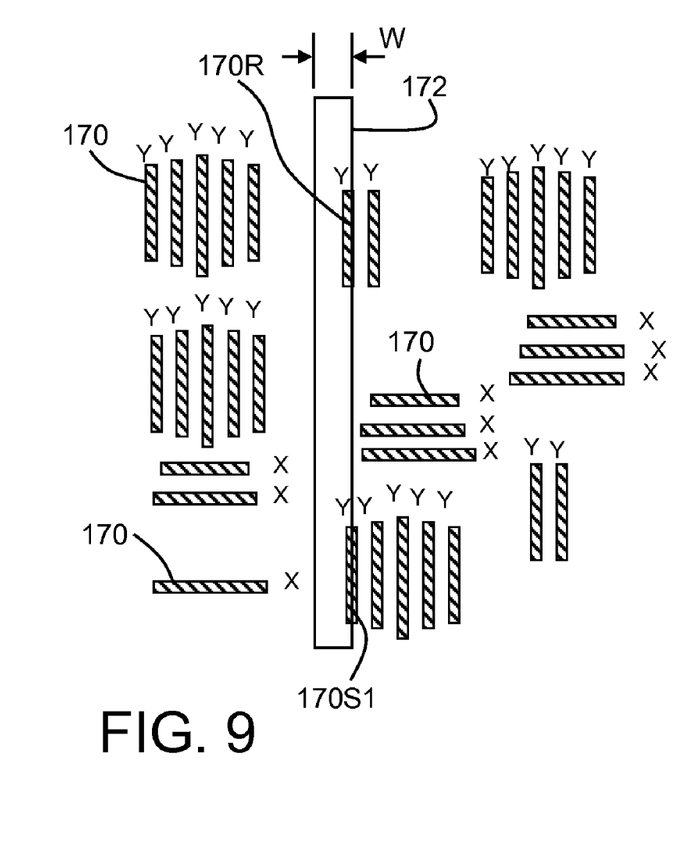
Figure 10:
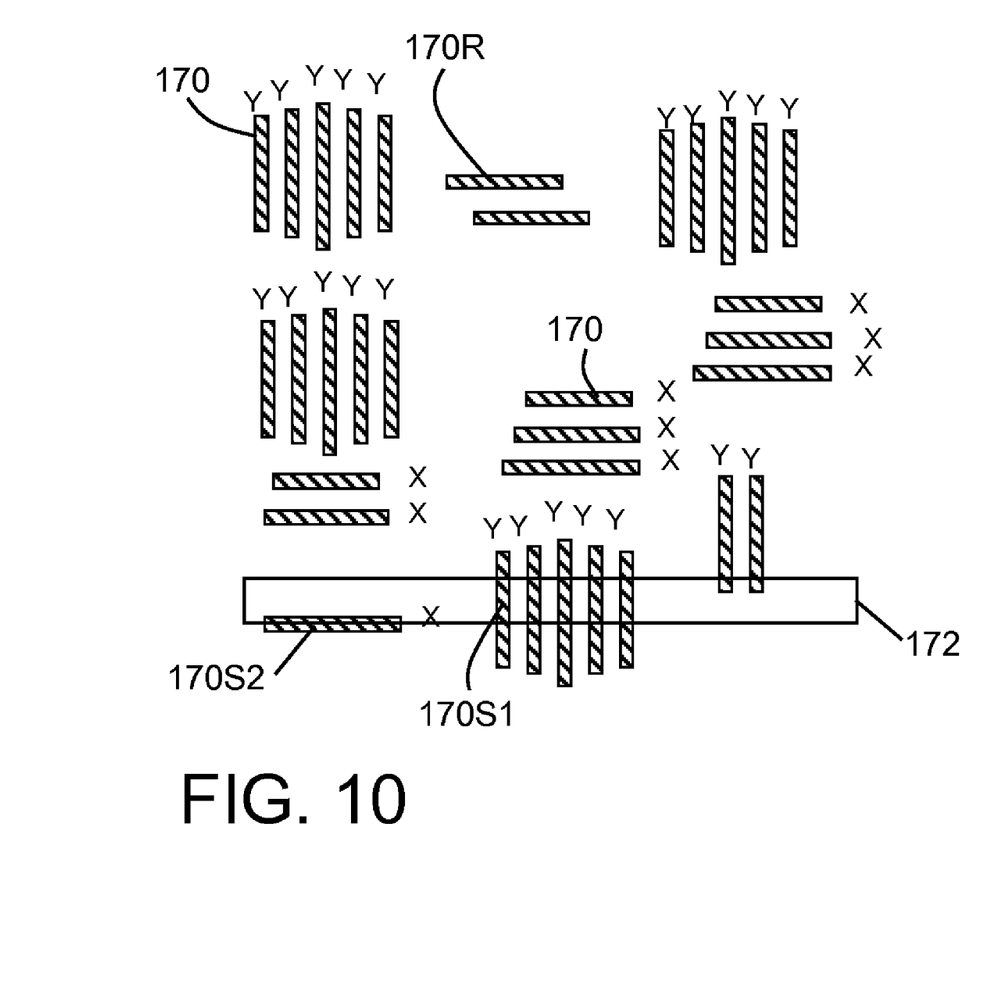

FIGS. 8-10 illustrate another situation in which a plurality of TSVs 170 have different orientations, e.g., random or semi-random. In this case, in process P1B1, direction determinator 146 determines a layout direction of each of the plurality of TSVs 170. This process may be carried out in any now known or later developed fashion, e.g., analytics, manual tagging of direction, etc. In process P1B2, as shown in FIG. 9, for each TSV 170, evaluation rectangle definer 142 defines a selected TSV evaluation rectangle 172 with a side thereof centered through the short edge of a selected TSV 170S1 and extending in a given direction (here vertically) to an edge of IC layout 90 (FIG. 2). A rectangle width W (FIG. 9 only) may be set to a constant dimension, e.g., 1 um, 11 um, etc., which may be based on a grid size of IC layout 90 or other factors, so as to evaluate a desired portion of IC layout 90 (FIG. 2). As shown in FIG. 9, identifier 140 identifies each TSV 170R that is linearly aligned with selected TSV 170S1 using the selected TSV evaluation rectangle 172. While only one TSV 170R is shown in violation of ground rules, it is understood that any number of TSVs may be identified, including zero.

In process P2, as shown in FIG. 10, modifier 150 modifies the IC layout by rotating each TSV 170R that is linearly aligned with the selected TSV 170S1 within selected TSV evaluation rectangle 172 to be non-aligned to the given direction. The above processes P1B1, P1B2 and P2 are repeated for each TSV 170, and, as shown in FIG. 10, may be repeated for another direction, e.g., horizontal. For example, FIG. 10 also shows another selected TSV 170S2 having an evaluation window 172. In this case, evaluation window 172 does not encompass any linearly aligned TSVs with selected TSV 170S2, and thus does not create any modifications.

The processes of P1A1-P1A2 and P1B1-P1B2 and corresponding modifications per process P2 may be carried out exclusively, or may be used together. For example, portions of IC layout 90 including TSV sets 162 may employ processes P1A1-P1A2, while other portions that are more random, may employ processes P1B1-P1B2.

The above-described system and methodology reduces or eliminates wafer breakage by arranging and design rule checking TSVs to avoid alignment, i.e., parallel edges from lining up, and creating high stress points, which cause wafer breakage during IC processing.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As discussed herein, various systems and components are described as "obtaining" data (e.g., IC layout 90, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

The method as described above is used in the design of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
    identifying, using at least one computer device, linearly aligned through silicon vias (TSVs) in a portion of an integrated circuit (IC) layout that includes a plurality of TSVs, the plurality of TSVs being linearly aligned with one another, wherein the portion includes an array of substantially uniform periodicity of through silicon via (TSV) sets, each of the TSV sets being arranged in a given direction, and the identifying including:
        defining a TSV set evaluation rectangle about each TSV set, each TSV set evaluation rectangle having a pair of X edges and a pair of Y edges,
        calculating a Y spacing between adjacent TSV evaluation rectangles and an X spacing between adjacent TSV evaluation rectangles, and
        expanding each TSV evaluation rectangle edge, excepting at a chip edge, in at least one Y direction by half the Y spacing between adjacent TSV evaluation rectangles and in at least one X direction by half the X spacing between adjacent TSV evaluation rectangles; and
    modifying, using the at least one computer device, at least the portion of the IC layout to reduce a number of the linearly aligned TSVs, the modifying including, in response to a Y edge of a selected, expanded TSV evaluation rectangle contacting a Y edge of an adjacent, expanded TSV evaluation rectangle or an X edge of the selected, expanded TSV evaluation rectangle contacting an X edge of an adjacent, expanded TSV evaluation rectangle, rotating the TSV set within the selected TSV evaluation rectangle to be non-aligned to the given direction.

2. The method of claim 1, further comprising repeating the identifying and the modifying on the array.

3. The method of claim 1, wherein the modifying further includes ensuring each individual TSV within a TSV set is on a predetermined grid for the IC layout regardless of position.

4. The method of claim 1, wherein all of the TSVs in each of the TSV sets in the IC layout initially extend in a single direction.

5. The method of claim 4, further comprising determining the constant dimension based on a grid size of the IC layout.

6. The method of claim 1, wherein the plurality of TSVs in the IC layout initially extend in a single direction.

7. A system comprising:
    an identifier for identifying linearly aligned through silicon vias (TSVs) in a portion of an integrated circuit (IC) layout that includes a plurality of TSVs, the plurality of TSVs being linearly aligned with one another, wherein the portion includes an array of substantially uniform periodicity of through silicon via (TSV) sets, each of the TSV sets being arranged in a given direction, and wherein the identifier:
        defines a TSV set evaluation rectangle about each TSV set, each TSV set evaluation rectangle having a pair of X edges and a pair of Y edges,
        calculates a Y spacing between adjacent TSV evaluation rectangles and an X spacing between adjacent TSV evaluation rectangles, and
        expands each TSV evaluation rectangle edge, excepting at a chip edge, in at least one Y direction by half the Y spacing between adjacent TSV evaluation rectangles and in at least one X direction by half the X spacing between adjacent TSV evaluation rectangles; and
    a modifier for modifying at least the portion of the IC layout to reduce a number of the linearly aligned TSVs, wherein the modifier, in response to a Y edge of a selected, expanded TSV evaluation rectangle contacting a Y edge of an adjacent, expanded TSV evaluation rectangle or an X edge of the selected, expanded TSV evaluation rectangle contacting an X edge of an adjacent, expanded TSV evaluation rectangle, rotates the TSV set within the selected TSV evaluation rectangle to be non-aligned to the given direction.

8. The system of claim 7, wherein the identifier and the modifier repeat the identifying and the modifying on the array.

9. The system of claim 7, wherein the modifier further ensures each individual TSV within a TSV set is on a predetermined grid for the IC layout regardless of position.

10. The system of claim 7, wherein all of the TSVs in the TSV sets in the IC layout initially extend in a single direction.

11. The system of claim 7, wherein the plurality of TSVs in the IC layout initially extend in a single direction.

12. The system of claim 7, wherein a constant dimension of the rectangle is based on a grid size of the IC layout.

13. A program product stored on a computer-readable storage device, which when executed, arranges through silicon vias, the program product comprising:

program code for identifying linearly aligned through silicon vias (TSVs) in a portion of an integrated circuit (IC) layout that includes a plurality of TSVs, the plurality of TSVs being linearly aligned with one another, wherein the portion includes an array of substantially uniform periodicity of through silicon via (TSV) sets, each of the TSV sets being arranged in a given direction, and the identifying program code includes program code for:

defining a TSV set evaluation rectangle about each TSV set, each TSV set evaluation rectangle having a pair of X edges and a pair of Y edges, calculating a Y spacing between adjacent TSV evaluation rectangles and an X spacing between adjacent TSV evaluation rectangles, and expanding each TSV evaluation rectangle edge, excepting at a chip edge, in at least one Y direction by half the Y spacing between adjacent TSV evaluation rectangles and in at least one X direction by half the X spacing between adjacent TSV evaluation rectangles; and program code for modifying at least the portion of the IC layout to reduce a number of the linearly aligned TSVs, wherein the modifying program code includes program code for, in response to a Y edge of a selected, expanded TSV evaluation rectangle contacting a Y edge of an adjacent, expanded TSV evaluation rectangle or an X edge of the selected, expanded TSV evaluation rectangle contacting an X edge of an adjacent, expanded TSV evaluation rectangle, rotating the TSV set within the selected TSV evaluation rectangle to be non-aligned to the given direction.

14. The program product of claim 13, wherein the modifying program code further ensures each individual TSV within a TSV set is on a predetermined grid for the IC layout regardless of position.

* * * * *